United States Patent
Yamada

(10) Patent No.: US 9,711,429 B2
(45) Date of Patent: Jul. 18, 2017

(54) SEMICONDUCTOR DEVICE HAVING A SUBSTRATE HOUSED IN THE HOUSING OPENING PORTION

(71) Applicant: FUJI ELECTRIC CO., LTD., Kawasaki-shi (JP)

(72) Inventor: Tadanori Yamada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/150,556

(22) Filed: May 10, 2016

(65) Prior Publication Data

US 2016/0365298 A1    Dec. 15, 2016

(30) Foreign Application Priority Data

Jun. 12, 2015    (JP) .................................. 2015-119372

(51) Int. Cl.
| H01L 23/495 | (2006.01) |
| H01L 23/373 | (2006.01) |
| H01L 23/057 | (2006.01) |
| H01L 23/31  | (2006.01) |
| H01L 23/13  | (2006.01) |
| H01L 23/498 | (2006.01) |
| H01L 23/24  | (2006.01) |

(52) U.S. Cl.
CPC ........ *H01L 23/3735* (2013.01); *H01L 23/057* (2013.01); *H01L 23/13* (2013.01); *H01L 23/3114* (2013.01); *H01L 23/49861* (2013.01); *H01L 23/24* (2013.01); *H01L 2224/48091* (2013.01); *H01L 2924/181* (2013.01)

(58) Field of Classification Search
CPC ............... H01L 23/495; H01L 23/3675; H01L 2225/06582
See application file for complete search history.

(56) References Cited

U.S. PATENT DOCUMENTS

2014/0299982 A1*  10/2014  Minamio ............... H01L 25/162
                                                                257/712
2014/0374889 A1   12/2014  Denta et al.

FOREIGN PATENT DOCUMENTS

JP         2000-133769 A    5/2000

* cited by examiner

*Primary Examiner* — Hoai V Pham
(74) *Attorney, Agent, or Firm* — Rabin & Berdo, P.C.

(57) ABSTRACT

In a semiconductor device, an insulating substrate housed in an housing opening portion of a resin case includes an insulating board, a first metal layer formed on the upper surface of the insulating board, a second metal layer which is formed on an outer peripheral edge portion of the upper surface of the insulating board and is in contact with a level difference portion, and a third metal layer formed on the under surface of the insulating board and leveled with or protruding from the under surface of the resin case. The first and second metal layers are formed by etching copper foil formed on the insulating board so that these metal layers have the same thickness. The thickness of the second metal layer may be changed relatively freely according to the housing depth of the resin case. Thus, the semiconductor device may be made thin.

12 Claims, 7 Drawing Sheets

SEMICONDUCTOR DEVICE HAVING A SUBSTRATE HOUSED IN THE HOUSING OPENING PORTION

CROSS-REFERENCE TO RELATED APPLICATION

This application is based upon and claims the benefit of priority of the prior Japanese Patent Application. No. 2015-119372, filed on Jun. 12, 2015, the entire contents of which are incorporated herein by reference.

BACKGROUND OF THE INVENTION

1. Field of the Invention

The embodiments discussed herein relate to a semiconductor device.

2. Background of the Related Art

With a semiconductor device in which an insulating substrate over whose upper surface a semiconductor element is disposed is housed in an opening portion of a case, a spacer which is an elastic member made of silicone-based resin, epoxy-based resin, urethane-based resin, or the like is disposed between the insulating substrate and the opening portion. By doing so, with the semiconductor device a heat radiation layer (metal layer) on the under surface of the insulating substrate is leveled with the under surface of the case. Furthermore, with the semiconductor device heat is effectively radiated by a heat radiation fin disposed on the under surface of the case (see, for example, Japanese Laid-open Patent Publication No. 2000-133769).

According to Japanese Laid-open Patent Publication No. 2000-133769, for example, a small spacer is needed for making a semiconductor device thinner. However, a spacer disclosed in, for example, Japanese Laid-open Patent Publication No. 2000-133769 is at least 1 mm in diameter, is at least 0.5 mm in height, and is a hemispheric elastic member of certain size. There is a limit to the miniaturization of such an elastic member used as a spacer. Accordingly, it may be difficult to make a semiconductor device thin.

SUMMARY OF THE INVENTION

According to an aspect, there is provided a semiconductor device including a case having in a first principal plane a housing opening portion on whose inner periphery a level difference portion is formed, an insulating substrate housed in the housing opening portion and having an insulating board, a first metal layer formed on a second principal plane of the insulating board, a second metal layer which is formed on an outer peripheral edge portion of the second principal plane and which is in contact with the level difference portion, and a third metal layer formed on a third principal plane of the insulating board and leveled with the first principal plane or protruding from the first principal plane, and a semiconductor element disposed over the first metal layer.

The object and advantages of the invention will be realized and attained by means of the elements and combinations particularly pointed out in the claims.

It is be understood that both the foregoing general description and the following detailed description are exemplary and explanatory and are not restrictive of the invention.

DETAILED DESCRIPTION OF THE INVENTION

Figure 1:
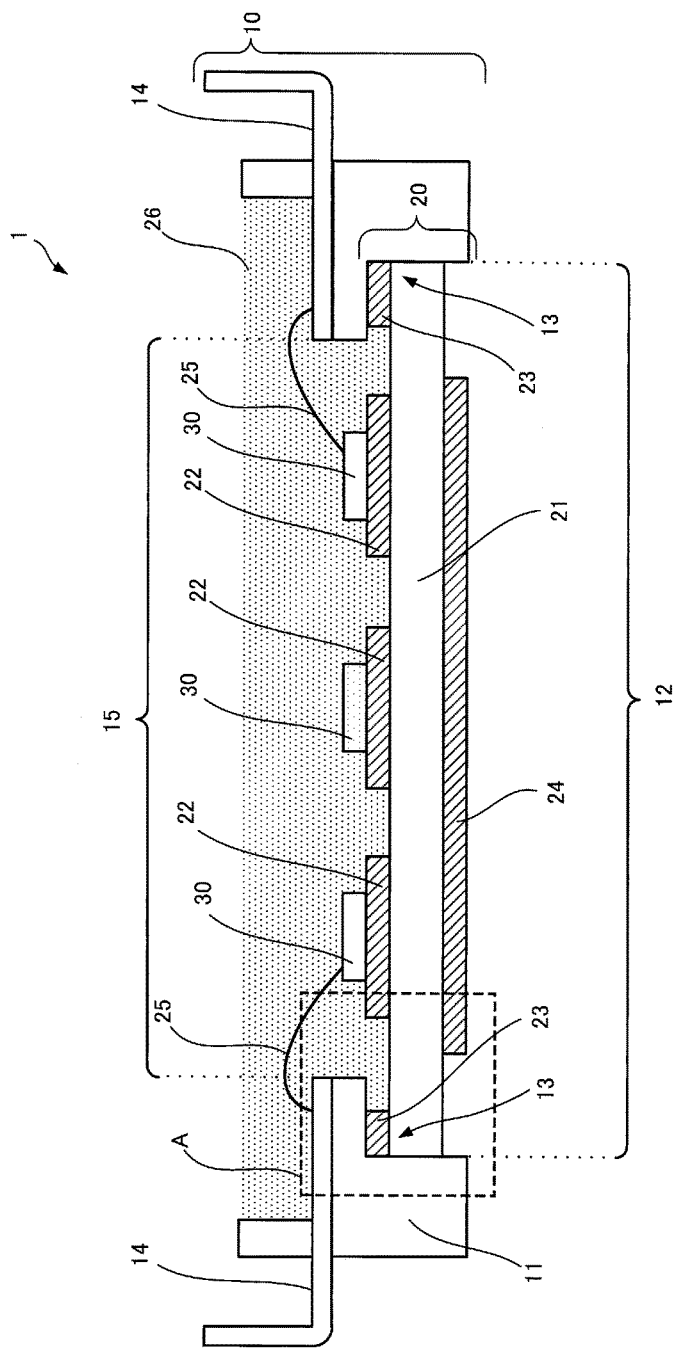
FIG. 1 is a sectional view of a semiconductor device according to a first embodiment.

Embodiments will now be described with reference to the accompanying drawings, wherein like reference numerals refer to like elements throughout.

First Embodiment

A semiconductor device according to a first embodiment will be described by the use of FIG. 1.

FIG. 1 is a sectional view of a semiconductor device according to a first embodiment.

A semiconductor device 1 includes a resin case 10, an insulating substrate 20 housed in the resin case 10, and a semiconductor element 30 disposed over the insulating substrate 20.

The resin case 10 is made of resin and includes a frame-shaped body portion 11, a level difference portion 13, and a lead frame 14 embedded in the body portion 11. A rectangular housing opening portion 12 is formed in the center of the under surface of the body portion 11 and a rectangular opening portion 15 is formed in the center of an upper surface of the body portion 11. The level difference portion 13 is formed along an inner periphery of the housing opening portion 12.

The insulating substrate 20 (or simply referred to as "substrate") includes a ceramic board (insulating board) 21, a first metal layer 22 formed on the upper surface of the ceramic board 21, a second metal layer 23 formed on the outer peripheral edge portion of the upper surface of the ceramic board 21, and a third metal layer 24 formed on the under surface of the ceramic board 21.

The ceramic board 21 is made of a ceramic material, such as alumina, aluminum nitride, or silicon nitride. The thermal conductivity of the ceramic board 21 is 100 W/(m·k) and its thickness is about 630 μm. In order to secure the durability of the ceramic board 21 against thermal stress, the ceramic board 21 needs at least this thickness.

The first metal layer 22, the second metal layer 23, and the third metal layer 24 are made of the same material such as copper. Furthermore, the thickness of the first metal layer 22, the second metal layer 23, and the third metal layer 24 is 200 to 400 μm and is, for example, about 240 μm in the first embodiment.

The semiconductor element 30 is an insulated gate bipolar transistor (IGBT), a metal oxide semiconductor field effect transistor (MOSFET), a free wheeling diode (FWD), or the like. The semiconductor element 30 is joined to the first metal layer 22 of the insulating substrate 20 by the use of solder (not illustrated).

With the semiconductor device 1, the insulating substrate 20 over which the semiconductor element 30 is disposed is housed in the housing opening portion 12 of the resin case 10 and an electrode (not illustrated) of the semiconductor element 30 and the lead frame 14 are electrically connected by a wire 25. Furthermore, with the semiconductor device 1 the insulating substrate 20 and the semiconductor element 30 in the housing opening portion 12 are sealed by sealing resin 26.

The disposition of the second metal layer 23 in the semiconductor device 1 relative to the insulating substrate 20 (ceramic board 21) will now be described by the use of FIG. 2.

Figure 2:
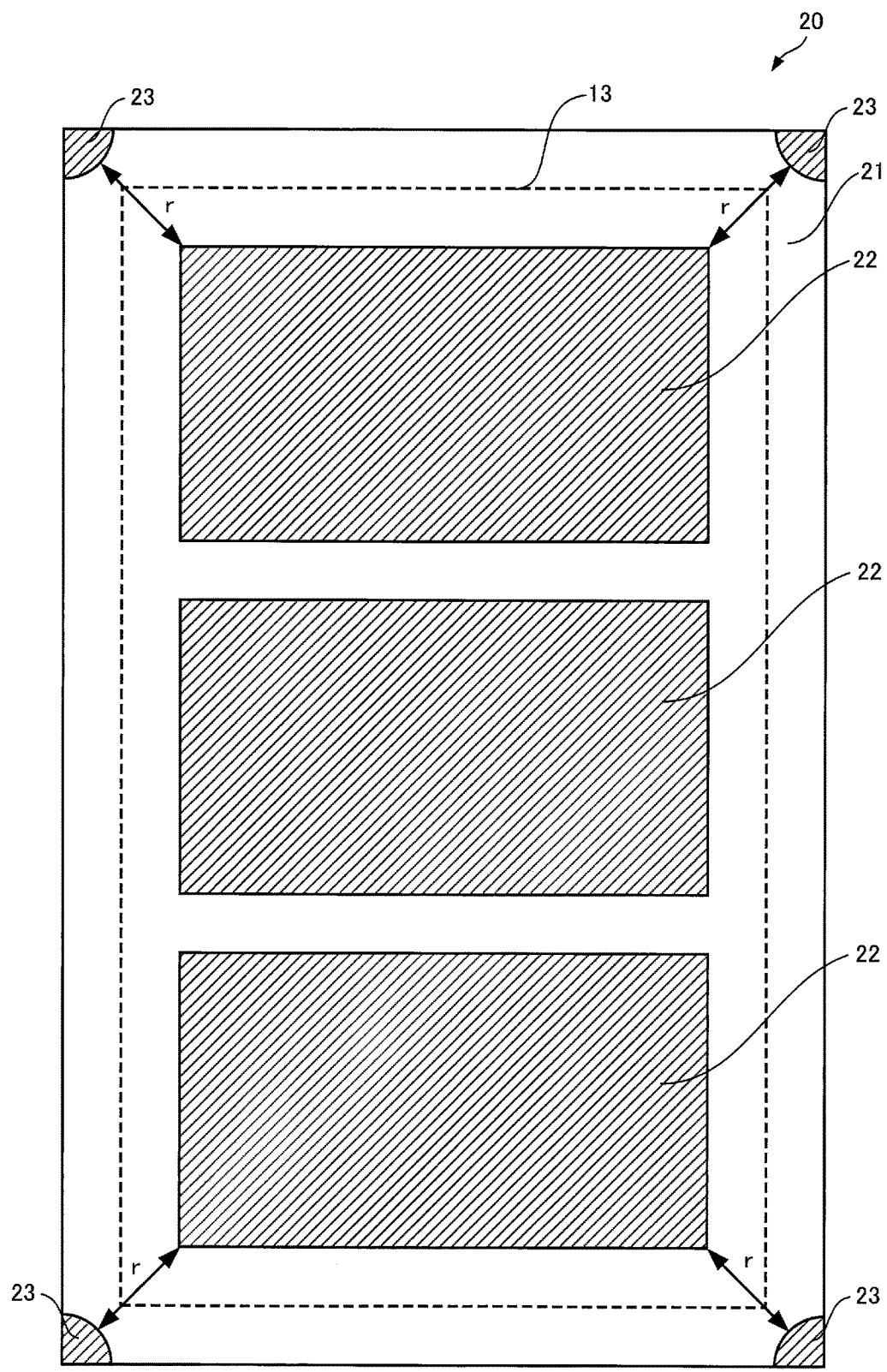
FIG. 2 is a plan view of an insulating substrate included in the semiconductor device according to the first embodiment.

FIG. 2 is a plan view of the insulating substrate included in the semiconductor device according to the first embodiment.

FIG. 2 is a plan view of the insulating substrate 20 in which the first metal layer 22 and the second metal layer 23 are disposed on the upper surface of the ceramic board 21. However, the semiconductor element 30 is not illustrated. Furthermore, the position of the level difference portion 13 formed by housing the insulating substrate 20 in the housing opening portion 12 of the resin case 10 is indicated by a dashed line.

As illustrated in FIG. 2, three first metal layers 22 are disposed on the ceramic board 21 of the insulating substrate 20. Each second metal layer 23 is formed on a corner portion of the outer peripheral edge portion of the upper surface of the ceramic board 21. Furthermore, when each second metal layer 23 is viewed from above, it has the shape of a convex circular arc (fan) with respect to the central portion of the insulating substrate 20. These first metal layers 22 and second metal layer 23 are formed in the same way by, for example, etching copper foil formed on the ceramic board 21 so as to have the same thickness.

Because each second metal layer 23 formed in this way has the shape of a convex circular arc (fan) with respect to the central portion of the insulating substrate 20, the distance from (corner portion of) a first metal layer 22 is kept at r or more.

An important part A illustrated in the sectional view of the semiconductor device 1 of FIG. 1 will now be described by the use of FIG. 3.

Figure 3:
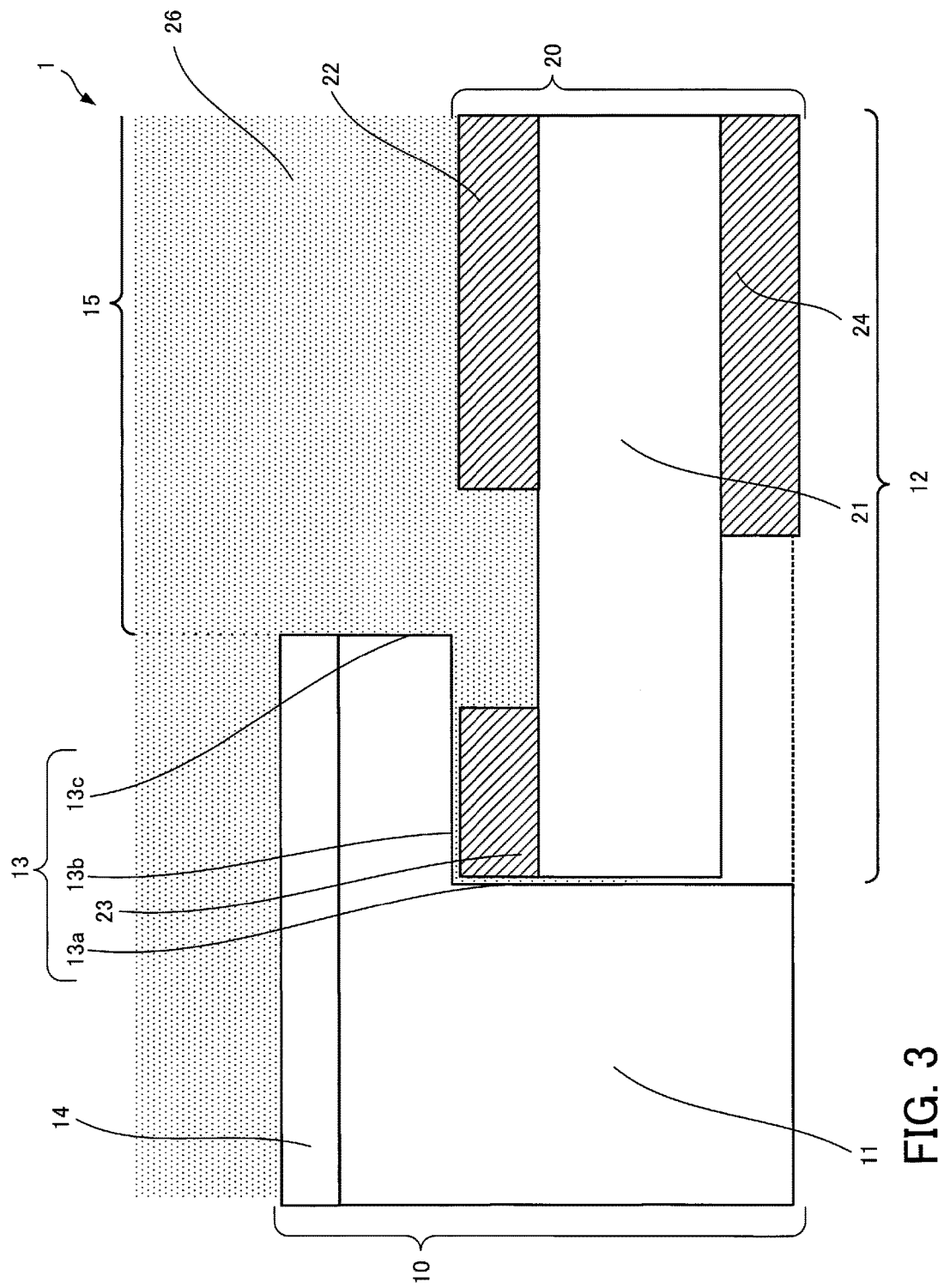
FIG. 3 is a fragmentary sectional view of the semiconductor device according to the first embodiment.

FIG. 3 is a fragmentary sectional view of the semiconductor device according to the first embodiment.

The level difference portion 13 formed in the housing opening portion 12 includes an inner peripheral surface 13a formed along an inner peripheral edge of the housing opening portion 12, a seating surface 13b perpendicular to the inner peripheral surface 13a and formed along the inner peripheral edge of the housing opening portion 12, and an inner peripheral surface 13c parallel to the inner peripheral surface 13a and formed along an inner peripheral edge of the opening portion 15 whose opening is narrower than an opening of the housing opening portion 12. As illustrated in FIG. 3, with the semiconductor device 1 the upper surface of the second metal layer 23 of the insulating substrate 20 is in contact with the seating surface 13b of the level difference portion 13 of the housing opening portion 12. A side of the second metal layer 23 of the insulating substrate 20 is in contact with the inner peripheral surface 13a of the level difference portion 13 of the housing opening portion 12. The dashed line in FIG. 2 which indicates the position of the level difference portion 13 corresponds to the inner peripheral surface 13c. The insulating substrate 20 is fitted in this way into the level difference portion 13 of the housing opening portion 12.

At this time the under surface of the third metal layer 24 of the insulating substrate 20 is leveled with the under surface (first principal plane) of the resin case 10 or protrudes from the under surface (first principal plane) of the resin case 10, depending on the thickness of the second metal layer 23. In FIG. 3, it is assumed that the depth of the resin case 10 for housing the insulating substrate 20 (height of the inner peripheral surface 13a (length from the under surface of the resin case 10 to the seating surface 13b)) is, for example, about 1.1 mm. Furthermore, it is assumed that the thickness of the insulating substrate 20 is approximately equal to at least the total thickness of the ceramic board 21 (630 μm), the second metal layer 23 (240 μm), and the third metal layer 24 (240 μm), that is to say, the thickness of the insulating substrate 20 is at least approximately 1.11 mm. FIG. 3 illustrates a case where the under surface of the third metal layer 24 protrudes from the under surface of the resin case 10.

As has been described, with the above semiconductor device 1 the insulating substrate 20 housed in the housing opening portion 12 of the resin case 10 includes the insulating board 21, the first metal layers 22 formed on the upper surface of the insulating board 21, the second metal layers 23 which are formed on the outer peripheral edge portions of the upper surface of the insulating board 21 and which are in contact with the level difference portion 13, and the third metal layer 24 formed on the under surface of the insulating board 21 and leveled with the under surface of the resin case 10 or protruding from the under surface of the resin case 10.

As stated above, the second metal layers 23, together with the first metal layers 22, are formed by etching copper foil or the like formed on the ceramic board 21 so as to have the same thickness as the first metal layers 22 have. The thickness of the second metal layers 23 that are formed in this way may be changed comparatively freely according to the housing depth of the resin case 10. As a result, the semiconductor device 1 is made thin.

Furthermore, with the semiconductor device 1 a space between the first metal layers 22 formed on the upper surface of the ceramic board 21 and the second metal layers 23 formed on the corner portions of the upper surface of the ceramic board 21 is sealed by the use of sealing resin 26. That is to say, the sealing resin 26 enters concavities and convexities formed by the first metal layers 22 and the second metal layers 23, and cures. By so doing, the adhesion of the sealing resin 26 to the resin case 10 and the insulating substrate 20 becomes stronger (anchor effect). Therefore, the disposition of the second metal layers 23 improves sealing capability by the sealing resin 26 and the reliability of the semiconductor device 1 against an external shock or the like.

In addition, with the semiconductor device 1 each second metal layer 23 is disposed on a corner portion of the upper surface of the ceramic board 21. When each second metal layer 23 is viewed from above, it has the shape of a convex circular arc (fan) with respect to the central portion of the insulating substrate 20. As a result, a certain distance is ensured between the second metal layer 23 and the first metal layer 22. Accordingly, insulation between the second metal layers 23 and the first metal layers 22 is maintained. To be concrete, a potential difference produced between a first metal layer 22 and a second metal layer 23 is calculated from a potential difference produced between the first metal layer 22 and the third metal layer 24 on the basis of the ratio of capacitance produced between the second metal layer 23 and the third metal layer 24 via the ceramic board 21 to capacitance produced between the first metal layer 22 and the second metal layer 23 via the sealing resin 26. A distance of r or more is ensured between the second metal layer 23 and the first metal layer 22 so that a potential difference between the first metal layer 22 and the second metal layer 23 will not exceed the dielectric strength voltage of the sealing resin 26.

Apart from the semiconductor device 1 according to the first embodiment, a semiconductor device in which another substrate over which the semiconductor element 30 is disposed is housed in the resin case 10 used in the first embodiment will now be described as an example for reference by the use of FIGS. 4A and 4B

Figure 4A:
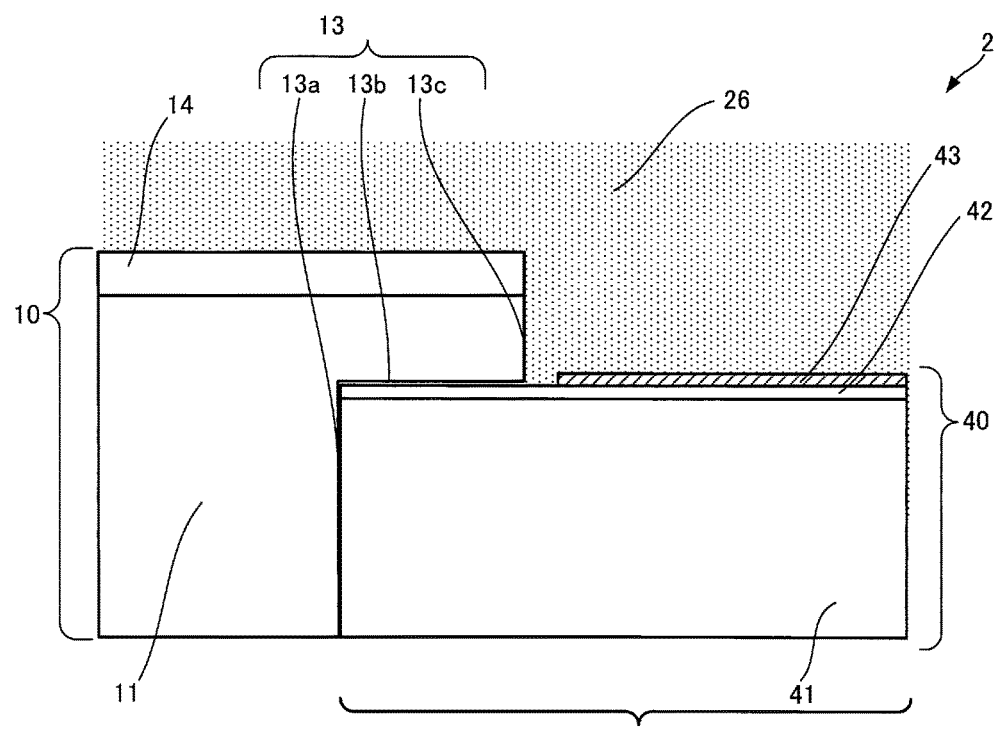
FIGS. 4A and 4B are fragmentary sectional views of a semiconductor device taken as an example for reference.
Figure 4B:
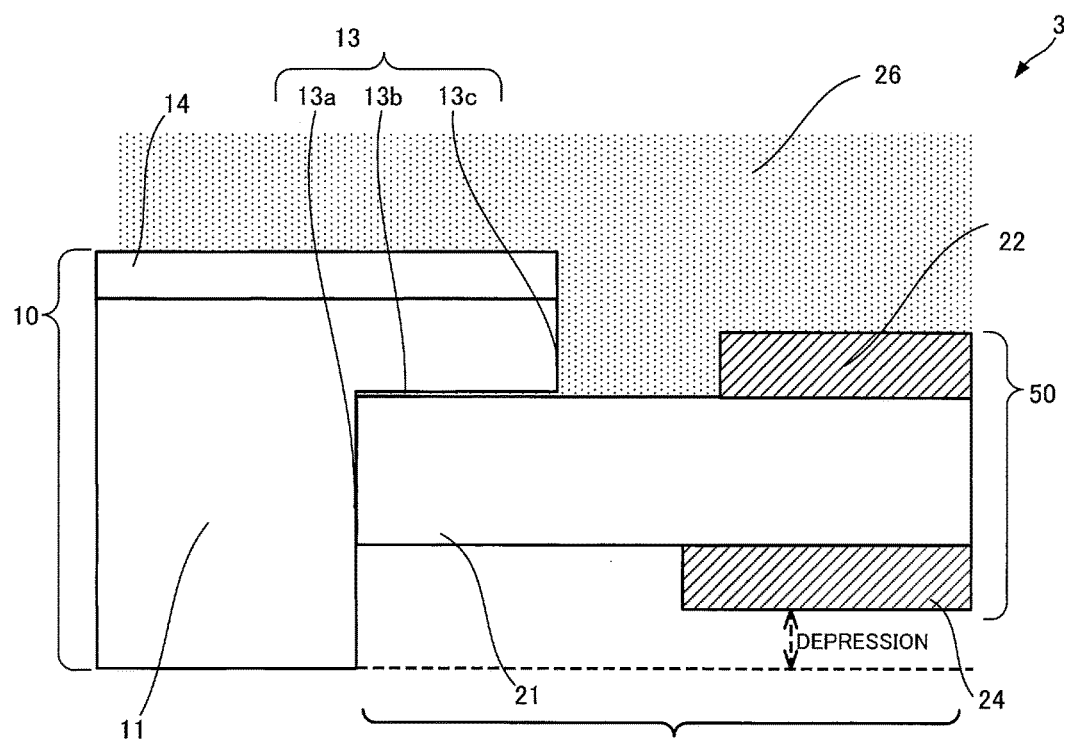

FIGS. 4A and 4B are fragmentary sectional views of a semiconductor device taken as an example for reference.

FIG. 4A illustrates a case where a metal insulating substrate 40 is housed in the resin case 10. FIG. 4B illustrates a case where the insulating substrate 20 except the second metal layers 23 is housed in the resin case 10. Furthermore, the semiconductor element 30 is not illustrated in FIG. 4A or 4B.

In FIG. 4A, the metal insulating substrate 40 is housed in the housing opening portion 12 of the resin case 10 used in the first embodiment.

The metal insulating substrate 40 includes a supporting base metal 41 made of aluminum or the like, an insulating board 42 made of a resin material and formed on the supporting base metal 41, and a metal layer 43 formed on the insulating board 42 by the use of copper foil or the like. The insulating board 42 of the metal insulating substrate 40 is in contact with the level difference portion 13 (seating surface 13b) of the resin case 10. This ensures insulation between the resin case 10 and the metal insulating substrate 40.

The thermal conductivity of the insulating board 42 is about 10 W/(m·k) and is sufficiently lower than that of the insulating substrate 20 (ceramic board 21) used in the first embodiment. Therefore, the insulating board 42 of the metal insulating substrate 40 is made thinner. That is to say, the thickness of the insulating board 42 is set to about 100 μm so as to maintain certain thermal conductivity.

Furthermore, in order to ensure the strength of the metal insulating substrate 40, the thickness of the supporting base metal 41 is set to about 1 mm. When the metal insulating substrate 40 is housed in the housing opening portion 12 of the resin case 10, the metal insulating substrate 40 may be made to protrude from the under surface of the resin case 10 by about 50 μm in order to reduce and stabilize the thermal resistance of an external cooling body disposed on the under surface of the resin case 10 and the metal insulating substrate 40. The depth of the resin case 10 needed for housing the metal insulating substrate 40 is approximately equal to at least the total of the thickness of the supporting base metal 41 and the insulating board 42 of the metal insulating substrate 40, that is to say, the depth of the resin case 10 needed for housing the metal insulating substrate 40 is at least approximately 1.1 mm.

In the first embodiment, on the other hand, the insulating substrate 20 including the first metal layers 22 and the second metal layers 23 is housed in the resin case 10. The insulating substrate 20 includes the second metal layers 23 (FIG. 3). As a result, the resin case 10 which houses the metal insulating substrate 40 can be used. Furthermore, the under surface of the third metal layer 24 of the insulating substrate 20 is leveled with the under surface of the resin case 10 or protrudes from the under surface of the resin case 10. Therefore, the thermal resistance of an external cooling body disposed on the under surface of the resin case 10 and the insulating substrate 20 is reduced and stabilized. This is the same with FIG. 4A. In addition, the thermal conductivity of the ceramic board 21 of the insulating substrate 20 is 100 W/(m·k) and is higher than that of the insulating board 42 of the metal insulating substrate 40. Accordingly, the insulating substrate 20 is superior in heat radiation property to the metal insulating substrate 40.

Furthermore, FIG. 4B illustrates a case where an insulating substrate 50 which does not include a second metal layer 23 and which includes a first metal layer 22 on its upper surface and a third metal layer 24 on its under surface is housed in the resin case 10. In this case, the under surface of the third metal layer 24 of the insulating substrate 50 is not leveled with the under surface of the resin case 10. As a result, a depression appears in the housing opening portion 12 of the resin case 10 in which the insulating substrate 50 is housed. If an external cooling body is disposed on the under surface of the resin case 10, there is clearance between the external cooling body and the insulating substrate 50 (third metal layer 24). This leads to degradation in the heat radiation property.

To deal with this, the first metal layer 22 and the third metal layer 24 may be made thicker so that clearance will not be left between the external cooling body and the insulating substrate 50. In this case, however, the thermal expansion amounts of the first metal layer 22 and the third metal layer 24 become larger. As a result, a greater stress is created in a ceramic board 21. This leads to a deterioration in the reliability. Furthermore, when copper foil formed on the ceramic board 21 is etched to form the first metal layer 22 and the third metal layer 24, the etching amounts of the first metal layer 22 and the third metal layer 24 in the horizontal direction (in the direction of the plane of the ceramic board 21) increase in proportion to the thickness of the copper foil. As a result, the interval between adjacent first metal layers 22 becomes wider and the area of each first metal layer 22 becomes smaller. This makes it difficult to ensure an area over which the semiconductor element 30 is mounted. In addition, the use of thick copper foil increases a material price and man-hours for performing a process, that is to say, the costs.

Another method for not leaving clearance between the external cooling body and the insulating substrate 50 (third metal layer 24) may be to make the ceramic board 21 thicker. However, if a thick ceramic board 21 is used, the thermal conductivity becomes higher. This leads to degradation in the heat radiation property.

In the first embodiment, on the other hand, the second metal layers 23 are formed over the corner portions of the insulating substrate 20 (ceramic board 21). As a result, the under surface of the third metal layer 24 of the insulating substrate 20 is leveled with the under surface of the resin case 10 or protrudes from the under surface of the resin case 10. Therefore, even if an external cooling body is disposed on the under surface of the resin case 10, there is no clearance between the insulating substrate 20 (third metal layer 24) and the external cooling body. This minimizes the risk of degradation in the heat radiation property. Furthermore, unlike FIG. 4B, the ceramic board 21, the first metal layers 22, or the third metal layer 24 included in the insulating substrate 20 is not thick. This prevents, at the time of forming the first metal layers 22 by etching, the interval between adjacent first metal layers 22 from widening, and therefore an area over which the semiconductor element 30 is mounted is ensured. In addition, this prevents a material price and man-hours for performing a process, that is to say, the costs from rising. The ceramic board 21 is not thick. This prevents degradation in the heat conduction property of the ceramic board 21 and degradation in the heat radiation property of the insulating substrate 20.

Second Embodiment

In a second embodiment a case where an insulating substrate 20 includes a second metal layer different from the second metal layers 23 used in the first embodiment will be described by the use of FIG. 5.

Figure 5:
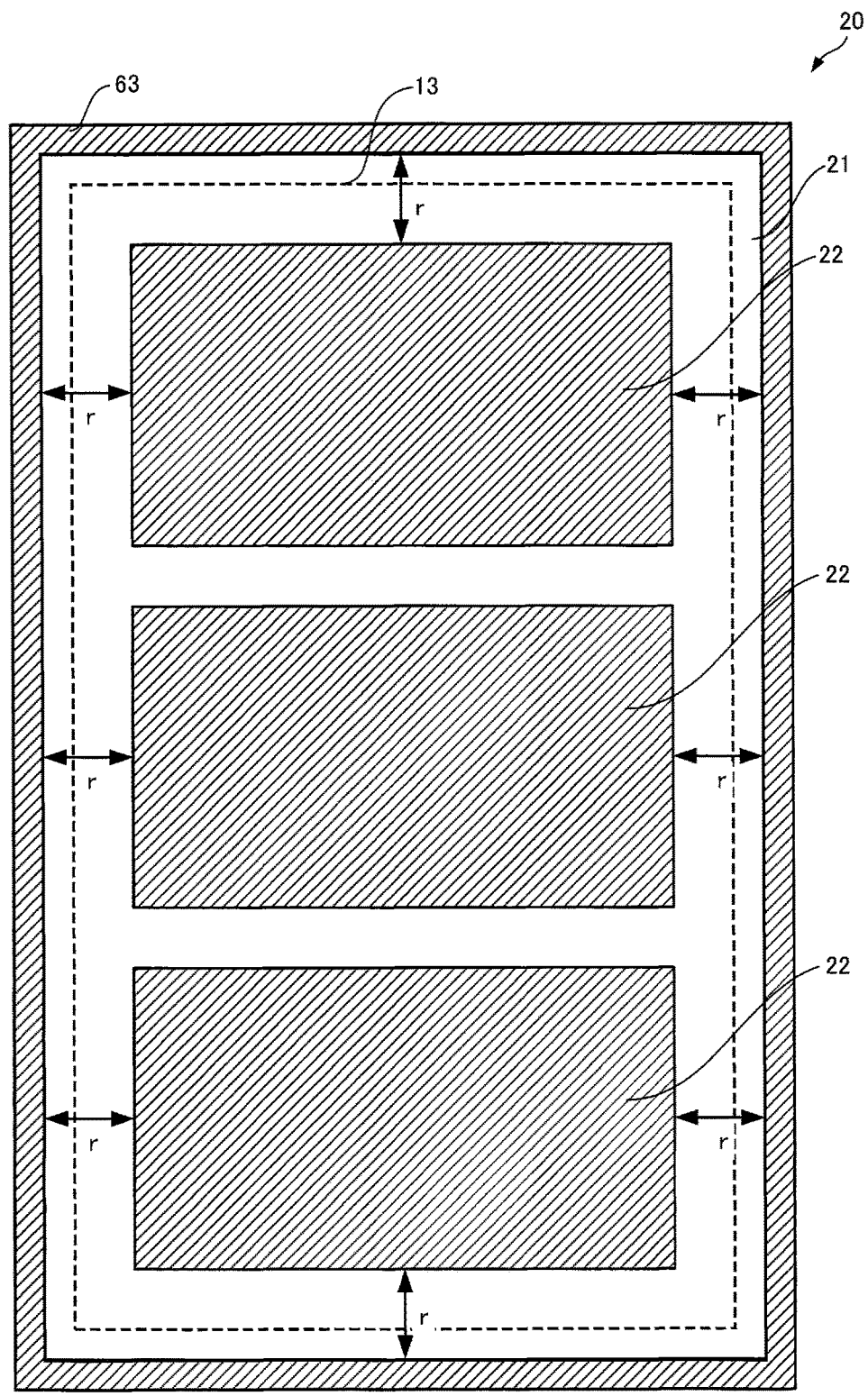
FIG. 5 is a plan view of an insulating substrate included in a semiconductor device according to a second embodiment.

FIG. 5 is a plan view of an insulating substrate included in a semiconductor device according to a second embodiment.

In the second embodiment, first metal layers 22 are formed on the upper surface of a ceramic board 21 and a third metal layer 24 (not illustrated) is formed on the under surface of the ceramic board 21. This is the same with the first embodiment (FIG. 2).

Furthermore, as illustrated in FIG. 5, a second metal layer 63, together with the first metal layers 22, is formed on the upper surface of the ceramic board 21. Semiconductor elements 30 disposed over the first metal layers 22 are not illustrated. In addition, the position of a level difference portion 13 formed by housing the above insulating substrate 20 in a housing opening portion 12 of a resin case 10 (not illustrated) is indicated by a dashed line in FIG. 5.

As illustrated in FIG. 5, the second metal layer 63 in the second embodiment is disposed on outer peripheral edge portions of the upper surface of the ceramic board 21. Furthermore, the distance from a first metal layer 22 to the second metal layer 63 is kept at r or more.

The insulating substrate 20 including the second metal layer 63 is housed in the housing opening portion 12 of the resin case 10. A space between the first metal layers 22 formed on the upper surface of the ceramic board 21 and the second metal layer 63 formed on the outer peripheral edge portions of the upper surface of the ceramic board 21 is sealed by the use of sealing resin 26. That is to say, the sealing resin 26 enters concavities and convexities on the ceramic board 21 formed by the first metal layers 22 and the second metal layer 63, and cures. By so doing, the adhesion of the sealing resin 26 to the resin case 10 and the insulating substrate 20 becomes stronger. In this case, the second metal layer 63 is formed on the outer peripheral edge portions of the upper surface of the ceramic board 21. Therefore, compared with the case of the first embodiment, the area of contact with the sealing resin 26 is large. As a result, compared with the case of the first embodiment, sealing capability by the sealing resin 26 is large.

In addition, because a certain distance is ensured between the second metal layer 63 and the first metal layers 22, insulation between the second metal layer 63 and the first metal layers 22 is maintained.

Third Embodiment

In a third embodiment a case where the insulating substrate 20 used in the first embodiment includes a plurality of second metal layers in its outer peripheral edge portions will be described by the use of FIG. 6.

Figure 6:
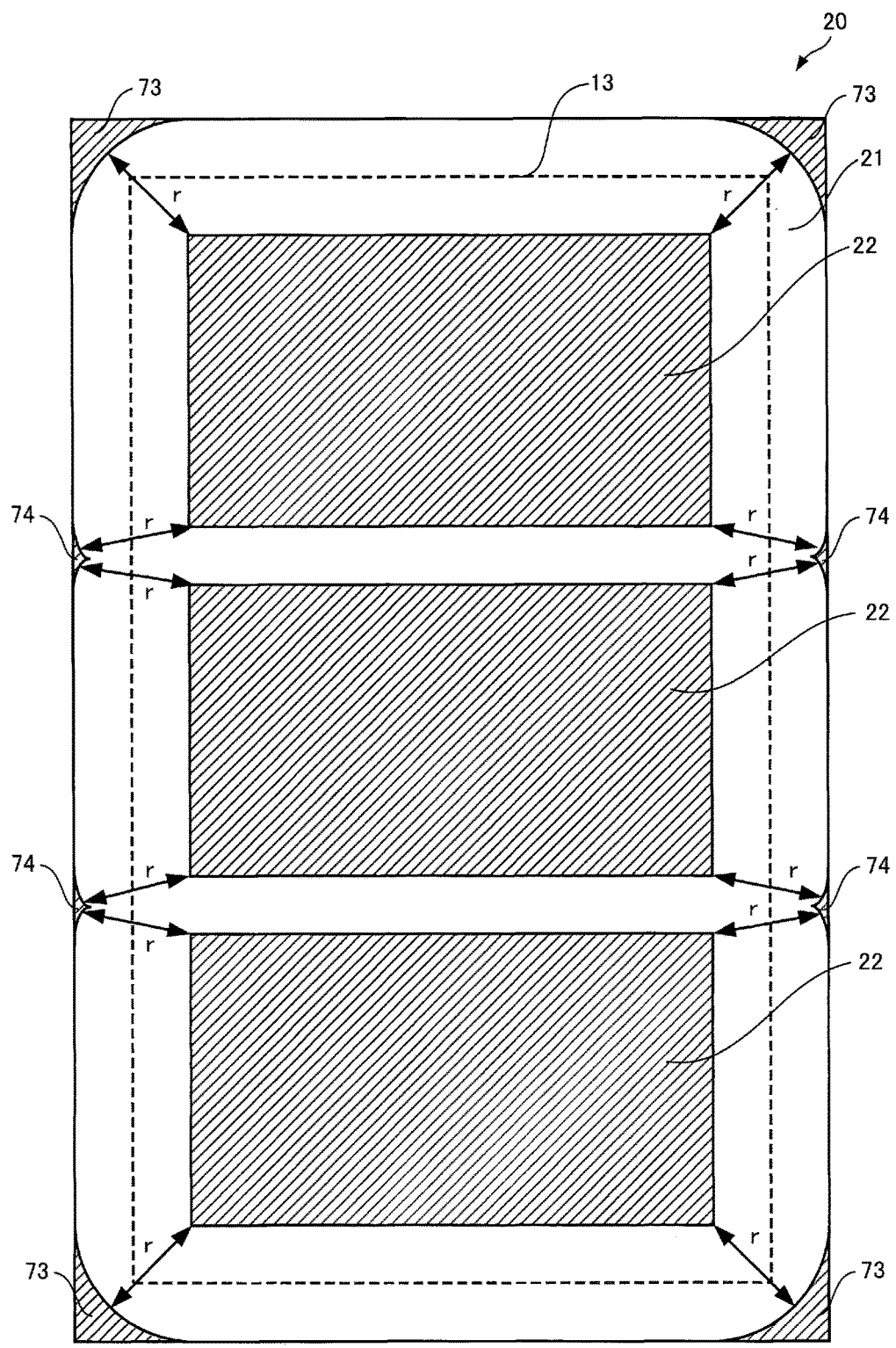
FIG. 6 is a plan view of an insulating substrate included in a semiconductor device according to a third embodiment.

FIG. 6 is a plan view of an insulating substrate included in a semiconductor device according to a third embodiment.

In the third embodiment, first metal layers 22 are formed on the upper surface of a ceramic board 21 and a third metal layer 24 (not illustrated) is formed on the under surface of the ceramic board 21. This is the same with the first embodiment (FIG. 2).

Furthermore, as illustrated in FIG. 6, second metal layers 73 and 74, together with the first metal layers 22, are formed on the upper surface of the ceramic board 21. Semiconductor elements 30 disposed over the first metal layers 22 are not illustrated. In addition, the position of a level difference portion 13 formed by housing the above insulating substrate 20 in a housing opening portion 12 of a resin case 10 is indicated by a dashed line in FIG. 6.

The second metal layers 73 are disposed on corner portions of outer peripheral edge portions of the upper surface of the ceramic board 21. Furthermore, the second metal layers 74 are disposed on sides in the longitudinal direction of the outer peripheral edge portions of the upper surface of the ceramic board 21.

As illustrated in FIG. 6, when each second metal layer 73 in the third embodiment is viewed from above, it has the shape of a concave circular arc with respect to the central portion of the insulating substrate 20. As a result, a distance of r is maintained between a second metal layer 73 and a corner portion of a corresponding first metal layer 22.

In addition, each second metal layer 74 has the shape of an isosceles triangle and each of its two sides which are equal in length has the shape of a concave circular arc with respect to the central portion of a corresponding first metal layer 22. In addition, each second metal layer 74 is disposed on a side in the longitudinal direction of the outer peripheral edge portions of the upper surface of the ceramic board 21 so that its vertex will be at the same distance from corner portions of adjacent first metal layers 22 opposite to each other. Two sides of each second metal layer 74 which are equal in length have the shape of a concave circular arc with respect to the central portions of adjacent first metal layers 22. As a result, a distance of r is maintained between a second metal layer 74 and corner portions of adjacent first metal layers 22 opposite to each other.

The insulating substrate 20 including the second metal layers 73 and 74 is housed in the housing opening portion 12 of the resin case 10. A space between the first metal layers 22 formed on the upper surface of the ceramic board 21 and the second metal layers 73 and 74 formed on the outer peripheral edge portions of the upper surface of the ceramic board 21 is sealed by the use of sealing resin 26. That is to say, the sealing resin 26 enters concavities and convexities on the ceramic board 21 formed by the first metal layers 22 and the second metal layers 73 and 74, and cures. By so doing, the adhesion of the sealing resin 26 to the resin case 10 and the insulating substrate 20 becomes stronger. In this case, in addition to the second metal layers 73, the second metal layers 74 are formed on the outer peripheral edge portions of the upper surface of the ceramic board 21. Therefore, compared with the first embodiment, the area of contact with the sealing resin 26 is large. As a result, compared with the case of the first embodiment, sealing capability by the sealing resin 26 is large.

In addition, because a distance of r is ensured between the second metal layers 73 or 74 and the first metal layers 22, insulation between the second metal layers 73 or 74 and the first metal layers 22 is maintained.

Fourth Embodiment

In a fourth embodiment a case where the insulating substrate 20 used in the first embodiment includes a plurality of second metal layers in its outer peripheral edge portions will be described by the use of FIG. 7.

Figure 7:
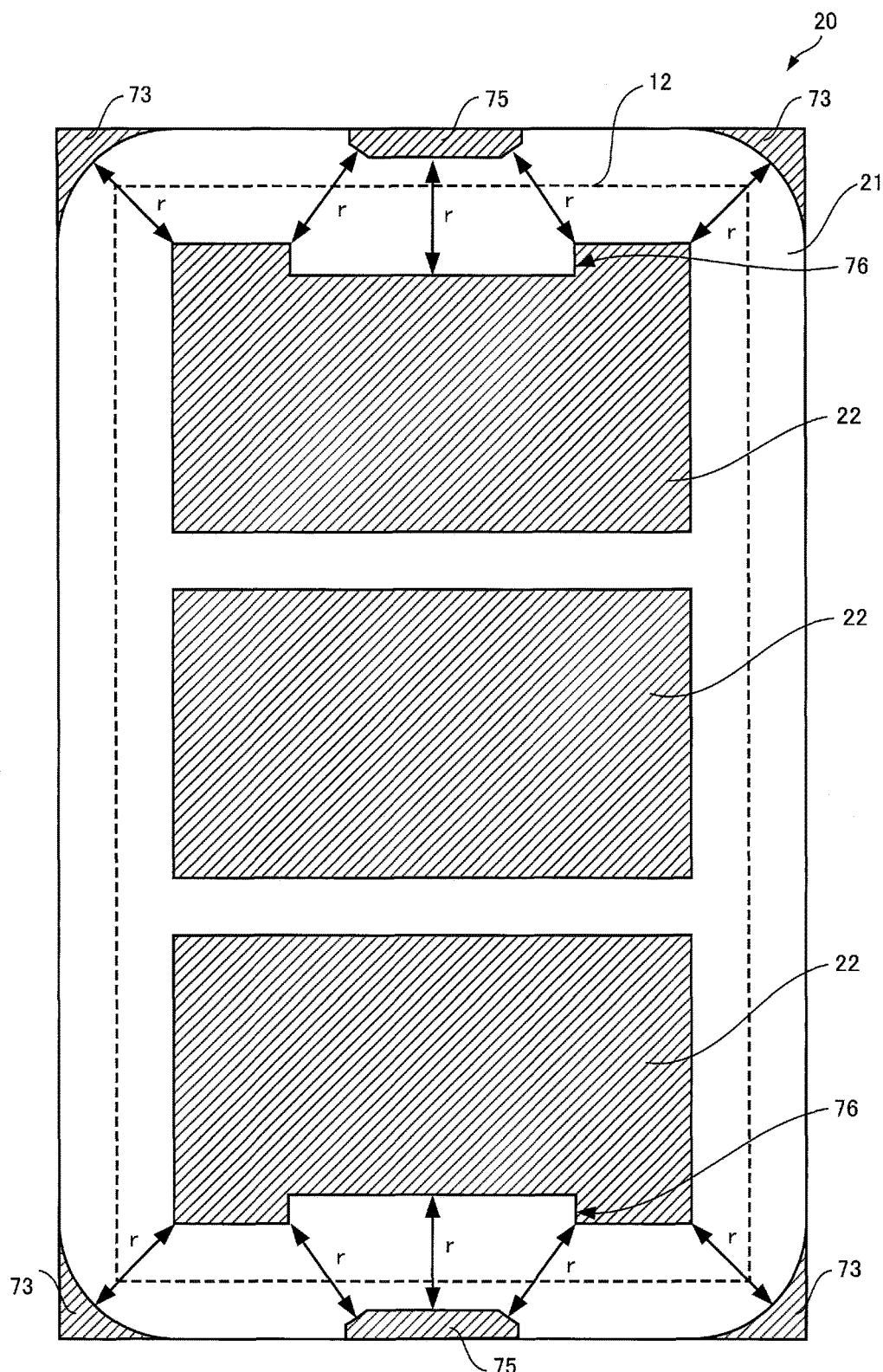
FIG. 7 is a plan view of an insulating substrate included in a semiconductor device according to a fourth embodiment.

FIG. 7 is a plan view of an insulating substrate included in a semiconductor device according to a fourth embodiment.

In the fourth embodiment, first metal layers 22 are formed on the upper surface of a ceramic board 21 and a third metal layer 24 (not illustrated) is formed on the under surface of the ceramic board 21. This is the same with the first embodiment (FIG. 2).

Furthermore, as illustrated in FIG. 7, second metal layers 73 and 75, together with the first metal layers 22, are formed on the upper surface of the ceramic board 21. Semiconductor elements 30 disposed over the first metal layers 22 are not illustrated. In addition, the position of a level difference portion 13 formed by housing the above insulating substrate 20 in a housing opening portion 12 of a resin case 10 is indicated by a dashed line in FIG. 7.

The second metal layers 73 are disposed on corner portions of outer peripheral edge portions of the upper surface of the ceramic board 21. Furthermore, the second metal layers 75 are disposed on sides in the lateral direction of the outer peripheral edge portions of the upper surface of the ceramic board 21. In addition, notch portions 76 are formed on sides of the first metal layers 22 opposite to the second metal layers 75. The notch portions 76 of the first metal layers 22 are formed so that areas of the first metal layers 22 over which the semiconductor elements 30 are disposed will be ensured.

When each second metal layer 73 in the fourth embodiment is viewed from above, it has the shape of a concave circular arc with respect n the central portion of the insulating substrate 20. This is the same with the third embodiment. As a result, a distance of r is maintained between a second metal layer 73 and a corner portion of a corresponding first metal layer 22.

In addition, as illustrated in FIG. 7, each second metal layer 75 has the shape of an isosceles trapezoid and is disposed on the middle portion of a side in the lateral direction of the outer peripheral edge portions of the upper surface of the ceramic board 21. In addition, each second metal layer 75 is disposed so that it will be opposite to the notch portion 76 of a first metal layer 22. As a result, a distance of r is maintained between a second metal layer 75 and a corresponding first metal layer 22.

The insulating substrate 20 including the second metal layers 73 and 75 is housed in the housing opening portion 12 of the resin case 10. A space between the first metal layers 22 formed on the upper surface of the ceramic board 21 and the second metal layers 73 and 75 formed on the outer peripheral edge portions of the upper surface of the ceramic board 21 is sealed by the use of sealing resin 26. That is to say, the sealing resin 26 enters concavities and convexities on the ceramic board 21 formed by the first metal layers 22 (and the notch portions 76 of the first metal layers 22) and the second metal layers 73 and 75, and cures. By so doing, the adhesion of the sealing resin 26 to the resin case 10 and the insulating substrate 20 becomes stronger. In this case, in addition to the second metal layers 73, the second metal layers 75 are formed on the outer peripheral edge portions of the upper surface of the ceramic board 21. Therefore, compared with the first embodiment, the area of contact with the sealing resin 26 is large. As a result, compared with the case of the first embodiment, sealing capability by the sealing resin 26 is large.

In addition, because a distance of r is ensured between the second metal layers 73 or 75 and the first metal layers 22 or the notch portions 76 of the first metal layers 22, insulation between the second metal layers 73 or 75 and the first metal layers 22 is maintained.

The second metal layers 74 in the third embodiment may be disposed on the ceramic board 21 of the insulating substrate 20 illustrated in FIG. 7. In this case, the insulating substrate 20 is housed in the housing opening portion 12 of the resin case 10. A space between the first metal layers 22 and the second metal layers 73, 74, and 75 formed on the outer peripheral edge portions of the upper surface of the ceramic board 21 is sealed by the use of sealing resin 26. In this case, unlike the first embodiment, the second metal layers 74 and 75 are formed in addition to the second metal layers 73 on the outer peripheral edge portions of the upper surface of the ceramic board 21. Accordingly, compared with the case of the first embodiment, sealing capability by the sealing resin 26 is large.

In addition, because a distance of r is ensured. between the second metal layers 73, 74, or 75 and the first metal layers 22 or the notch portions 76 of the first metal layers 22, insulation between the second metal layers 73, 74, or 75 and the first metal layers 22 is maintained.

According to the disclosed technique, a thin semiconductor device is provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a case having a level difference portion, the case further having, in a first principal plane of the case, a housing opening portion on whose inner periphery the level difference portion is formed;
   a substrate housed in the housing opening portion and including
      an insulating board,
      a first metal layer being formed on a second principal plane of the insulating board,
      a second metal layer formed on an outer peripheral edge portion of the second principal plane and being in contact with the level difference portion, and
      a third metal layer formed on a third principal plane of the insulating board to be level with the first principal plane or to protrude from the first principal plane; and
   a semiconductor element disposed over the first metal layer.

2. The semiconductor device according to claim 1, further comprising a sealing resin which seals the substrate at a position in the housing opening portion and the semiconductor element at a position in the housing opening portion.

3. The semiconductor device according to claim 1, wherein the insulating board is a ceramic board.

4. The semiconductor device according to claim 1, wherein:
   the first metal layer is rectangular when viewed from above; and the second metal layer is disposed on the insulating board to be at least a certain distance from the first metal layer.

5. The semiconductor device according to claim 4, wherein the second metal layer includes second metal layers formed on each corner portion of the second principal plane.

6. The semiconductor device according to claim 5, wherein:
   each of the second metal layers has a shape of a circular arc when viewed from above; and
   one of the second metal layers is disposed at least the certain distance from a corner portion of the first metal layer in proximity thereto.

7. The semiconductor device according to claim 6, wherein the second metal layers each has a shape of a convex or concave circular arc with respect to a center of the substrate when viewed from above.

8. The semiconductor device according to claim 4, wherein the second metal layer is formed on an outer peripheral edge portion of the insulating board.

9. The semiconductor device according to claim 4, wherein:
   the first metal layer includes first and second adjacent first metal layers, a corner portion of the first adjacent first metal layer being opposite to a corner portion of the second adjacent first metal layer;
   the second metal layer has a shape of an isosceles triangle; and
   the second metal layer is disposed on a side of the insulating board so that each of the two sides of the second metal layer, which are equal in length, has a shape of a concave circular arc with respect to a center of one of the first and second adjacent first metal layers In proximity thereto and so that a vertex of the second metal layer is at a same distance from the corner portions of the first and second adjacent first metal layers opposite to each other.

10. The semiconductor device according to claim 4, wherein:
   the second metal layer is disposed on a side of the insulating board opposite to the first metal layer;
   a notch portion is formed in the first metal layer on a side opposite to the second metal layer; and
   the first metal layer is disposed at least the certain distance from the second metal layer.

11. The semiconductor device according to claim 1, wherein the first metal layer and the second metal layer are made of a same material.

12. inc semiconductor device according to claim 1, wherein. the first metal layer and the second metal layer are disposed at a same level.

* * * * *